(12) United States Patent
Chang et al.

(10) Patent No.: US 7,704,368 B2
(45) Date of Patent: Apr. 27, 2010

(54) METHOD AND APPARATUS FOR ELECTROCHEMICAL PLATING SEMICONDUCTOR WAFERS

(75) Inventors: Chung-Liang Chang, Hsin-chu (TW); Shau-Lin Shue, Hsinchu (TW)

(73) Assignee: Taiwan Semiconductor Manufacturing Co. Ltd., HsinChu (TW)

( * ) Notice: Subject to any disclaimer, the term of this patent is extended or adjusted under 35 U.S.C. 154(b) by 1394 days.

(21) Appl. No.: 11/043,601

(22) Filed: Jan. 25, 2005

(65) Prior Publication Data

US 2006/0163076 A1 Jul. 27, 2006

(51) Int. Cl.
*C25D 7/12* (2006.01)
(52) U.S. Cl. .................. 205/157; 205/123; 205/125; 205/149; 205/152; 205/153; 205/236; 205/237; 205/238; 205/239; 205/242; 205/261; 205/253; 205/291

(58) Field of Classification Search .................. 205/123, 205/125, 149, 152, 153, 157, 236, 237, 239, 205/242, 261, 263, 291, 238
See application file for complete search history.

(56) References Cited

U.S. PATENT DOCUMENTS

2004/0149584 A1* 8/2004 Nagai et al. .................. 205/103
2005/0155866 A1* 7/2005 Gabe et al. .................. 205/296

* cited by examiner

*Primary Examiner*—Bruce F Bell
(74) *Attorney, Agent, or Firm*—Tung & Associates

(57) ABSTRACT

A method of electroplating conductive material on semiconductor wafers controls undesirable surface defects by reducing the electroplating current as the wafer is being initially immersed in a plating bath. Further defect reduction and improved bottom up plating of vias is achieved by applying a static charge on the wafer before it is immersed in the bath, in order to enhance bath accelerators used to control the plating rate. The static charge is applied to the wafer using a supplemental electrode disposed outside the plating bath.

23 Claims, 2 Drawing Sheets

METHOD AND APPARATUS FOR ELECTROCHEMICAL PLATING SEMICONDUCTOR WAFERS

FIELD OF THE INVENTION

This invention generally relates to electrodeposition of materials on semiconductor wafers, and deals more particularly with a method and apparatus for controlling the initial stage of the electroplating process in order to improve gap fill and reduce intrinsic defects.

BACKGROUND OF THE INVENTION

In order to increase signal speed performance in integrated circuits, copper and silver are being used with increasing frequency for interconnects because of their lower resistance compared to, for example, aluminum. In addition to possessing lower resistance compared to aluminum, copper possesses superior migration and exhibits higher reliability. The techniques used to achieve copper metallization include CVD, selective electroless deposition, sputtering (PVD) and electroplating. Electrochemical deposition of copper is a leading technology because of its low cost, fast deposition rate and superior copper properties. However, copper interconnect electrodeposition faces challenges in the form of non-uniformity of the copper layer over the wafer and filling of small, high aspect ratio contact holes without void formation.

The electrochemical deposition of copper is caused by the passage of electrical current between two electrodes through a copper sulfate solution or other copper containing electrolytes. The electrical current to the electrode is electronic, while the current in the electrolyte is ionic. At the cathode, electrochemical reduction occurs, while electrochemical oxidation occurs at the anode which is normally formed of copper. In this arrangement, copper ions removed at the cathode are replaced by copper ions produced at the anode. Copper ions are transported to the cathode by electrical drift, diffusion and convection. The required voltage necessary to pass a certain current is the sum of ohmic drop in the electrolyte, the surface over potential across the double layer and the concentration over potential associated with the diffusion layer. Electroplating can be carried out at constant current, constant voltage or variable forms of current or voltage. The distribution of current, and hence the distribution of the thickness of the copper layer across the cathode depends on its geometry, the kinetics of the electrochemical reaction and concentration variations, as determined by the hydrodynamics and the convective mass transport in the electrolyte.

In the case of copper electroplating on silicon wafer, the $SiO_2$-covered wafer is coated with a thin conductive layer of copper, normally referred to as the seed layer, in order to assure electronic conductivity. The wafer is exposed to an electrolyte containing copper ions and electrical contact is established between the seed layer and the power supply by several contact points along the periphery of the wafer. Constant current is passed for a certain length of time, resulting in a corresponding thickness of copper layer.

Because copper reacts with $SiO_2$, it is necessary to confine it using a barrier layer of material, such as tantalum nitride which is pre-deposited on the $SiO_2$ by sputtering. The copper seed layer is needed next for good electrical contact and inhesion. Copper electroplating is usually obtained from an aqueous solution of $CuSO_4$ and $H_2SO_4$, in the presence of several additives and leveling agents. Additives such as accelerators and suppressors are used to control deposition rate and assure void-free filling of sub-25 micron high aspect ratio structures. Suppressors absorb water on the surface and slow down copper deposition in the absorbed areas. The accelerator competes with suppressor molecules for adsorption sites and accelerates copper deposition in the absorbed areas. During electroplating, both the suppressor and the accelerator are consumed at the wafer surface but are being constantly replenished by diffusion from the bulk electrolyte.

Grain size, the presence of impurities, pitting and voids in the electroplated copper layer are only a few of the defects that can result from an improper balance in the electrochemistry during the plating process. In particular, the balance of the additives can be significantly affective by the voltage, current and plating times that are chosen during the plating process.

Accordingly, there is a clear need in the art for an improved process control that maintains plating bath additives in proper balance so that the desired defect-free plating build-up occurs, particularly in trenches and vias. The present invention is intended to satisfy this need.

SUMMARY OF THE INVENTION

According to one aspect of the invention, a method of electroplating at conductive material such as copper on a semiconductor wafer comprises immersing the wafer in a plating bath, applying a voltage to the wafer, passing an electrical current through the bath and the wafer, and limiting the current flow to a density of not greater than 0.1 amps per square centimeter as the wafer is being immersed. The step of limiting the current density is performed during the time period that the wafer is being initially immersed into the plating bath. A static electric charge preferably applied to the wafer before and during immersion in order to enhance competitive adsorption of an accelerator additive used in the bath to control the plating rate.

According to another aspect of the invention, electroplating apparatus for depositing a conductive material on a semiconductor wafer is provided, comprising a vessel for holding an electroplating bath, a support for holding a semi-conductive wafer within the vessel, a pair of electrodes within the vessel between which an electrical current may flow causing conductive material to be electrolytically deposited onto the wafer. The apparatus also includes a third electrode disposed outside of the bath for applying a static charge to the wafer, as well as a electrical power source supplying power to the third electrode. The third electrode is located outside the vessel but in proximity to the bath and is preferably charged to a voltage of between 1 and 100 volts.

A primary object of the present invention to provide an improved electroplating process for depositing conductive layers on a semi-conductor wafer that provides superior bottom up filling of trenches and vias, with fewer defects.

Another object of the invention is to provide an electroplating process as described above which provides accelerator adsorption or activation with less surface potential sensitivity.

Another object of the invention is to provide a process as described above which controls the initial deposit of the conductive material onto the wafer surface as the wafer is initially being immersed into the plating bath.

A further object of the invention is to provide improved electroplating apparatus that permits better control of process parameters during the stage of the plating process when the wafer is being initially immersed into the plating bath.

These, and further objects and advantages of the invention will be made clear or will become apparent during the course of the following description of a preferred embodiment of the invention.

BRIEF DESCRIPTION OF THE DRAWINGS

In the drawings, which form an integral part of the specification and are to be read in conjunction therewith, and in which like reference numerals are employed to designate identical components in the various views.

DETAILED DESCRIPTION OF THE PREFERRED EMBODIMENTS

The process for electroplating copper on a semi-conductor wafer begins with depositing a barrier layer of a material such as tantalum nitride by means such as sputtering. Next, a seed layer of copper is applied over the barrier layer using atomic layer deposition techniques. The seed layer of copper is applied to assure good electrical contact and adhesion of subsequent layers of copper. The seed layer of copper may be between 100 and 1000 angstroms. Copper electroplating is then performed in a conventional electroplating apparatus which includes a vessel containing an aqueous solution of $CuSO_4$ and $H_2SO_4$, in the presence of several additives and leveling agents. The wafer is held by flexibly mounted gripping fingers (not shown) on the bottom of a spinning clam shell support which rotates the wafer while submerged in the plating bath. The wafer is electrically connected to a power source and acts as a cathode. A copper anode disposed within the plating bath is also connected to the electrical power source. Suitable pumps are uses to create a flow of the plating bath over the face of the wafer as the latter is rotated up to speeds up to 2000 rpms. The plating process proceeds through four distinct stages, and in this connection reference is now made to FIG. 2. In a first stage referred to herein as the "approach" designated by the letter A in FIG. 2, the wafer is lowered into the plating bath, and as can be appreciated from FIG. 2, there is no current flow through the wafer. The next stage represented by the letter B, consists of moving the wafer down into the plating bath, i.e., immersing the wafer in the bath, at which time electrical current flow commences. The next stage designated by the letter C is referred to as the swing stage in which current flow is limited to a specified value for a pre-determined length of time, following which the fourth and final stage designated by the letter D is carried out, which consists of continuing the current flow at a higher level. In illustrated example, stage A requires 4.25 seconds to move the wafer into initial contact with the plating bath, at which time current flow commences and steadily builds until the end of stage B at 5.75 seconds of elapsed time. The applied current is held relatively constant until the end of Stage C at 8.25 seconds at which time it is increased and held constant throughout the final Stage D.

Figure 3:
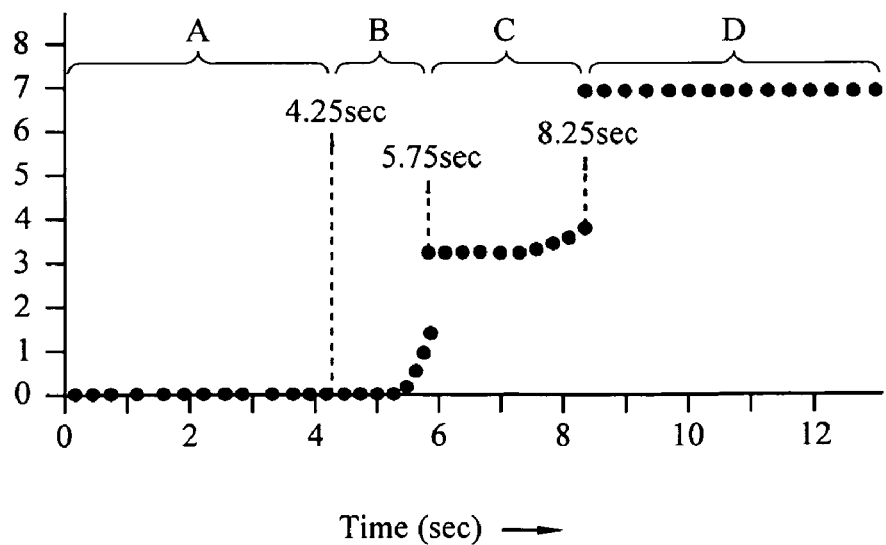

In accordance with the present invention, it has been found that the current flow occurring during the immersion or stage B has a significant affect on gap fill and the incubation time of bottom up fill initiation. This is the result of the current flow adversely affecting accelerator absorption or activation, or poisoning by suppressor additives in the plating bath. According to the present invention, the problems mentioned immediately above as well as the defects resulting therefrom can be substantially reduced by limiting the current density to no greater than about 0.1 amps per square centimeter, and preferably 0 amps per square centimeter. The step of limiting the current density during the immersion stage is graphically shown in FIG. 3, where the current is maintained near 0 until the end of the immersion Stage B.

Figure 2:
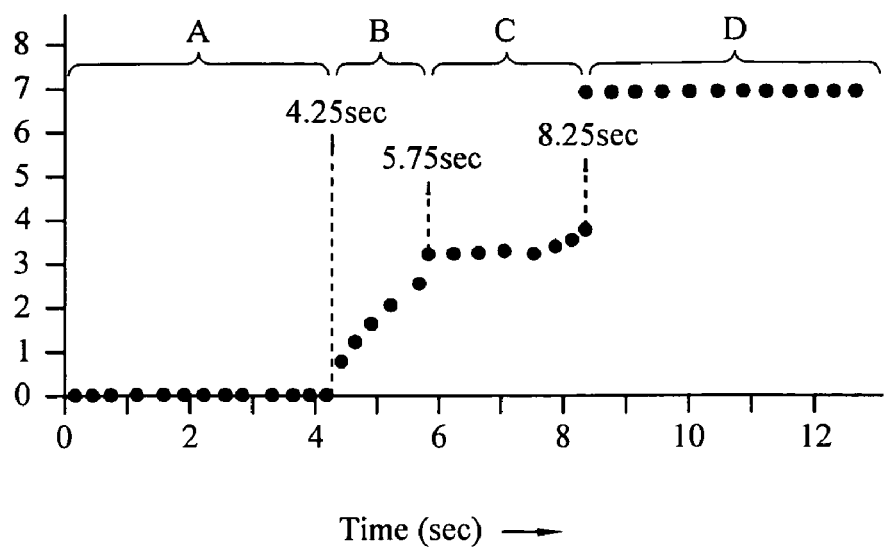
FIG. 2 is a graph showing plating current over time for a prior art electroplating process; and, FIG. 3 is a graph similar to FIG. 2 but showing current flow over time for the process forming the preferred embodiment of the present invention.

A series of experiments were performed using a variety of commercially available plating solutions and a variety of voltages and currents applied during the plating process. The 0 or near 0 current densities during the immersion stage are achieved by reducing the applied voltage to the circuit containing the wafer of the bath. For example, in one set of experiments, the voltage applied during the immersion stage was 0.2 volts, compared to 3.5 volts applied during this stage using the conventional plating techniques (FIG. 2). The inventive technique, which will be referred to herein as "low bias entry" was found to be particularly effective in reducing defects when higher annealing temperatures were used following the plating process. For example, using the inventive low bias entry technique described above, wafers exhibited significantly lower defects when annealed at temperatures at 260 degrees centigrade, compared to lower temperatures, e.g. 180 degrees centigrade. The lower bias entry technique reduces the deposition rate during the immersion stage B, and effectively provides buffer time during which pre-layer particles are removed so that a uniform surface coverage of additives can be formed. The lower bias entry technique was also found to increase SM reliability, regardless of the mix of chemicals used in the electroplating bath.

Figure 1:
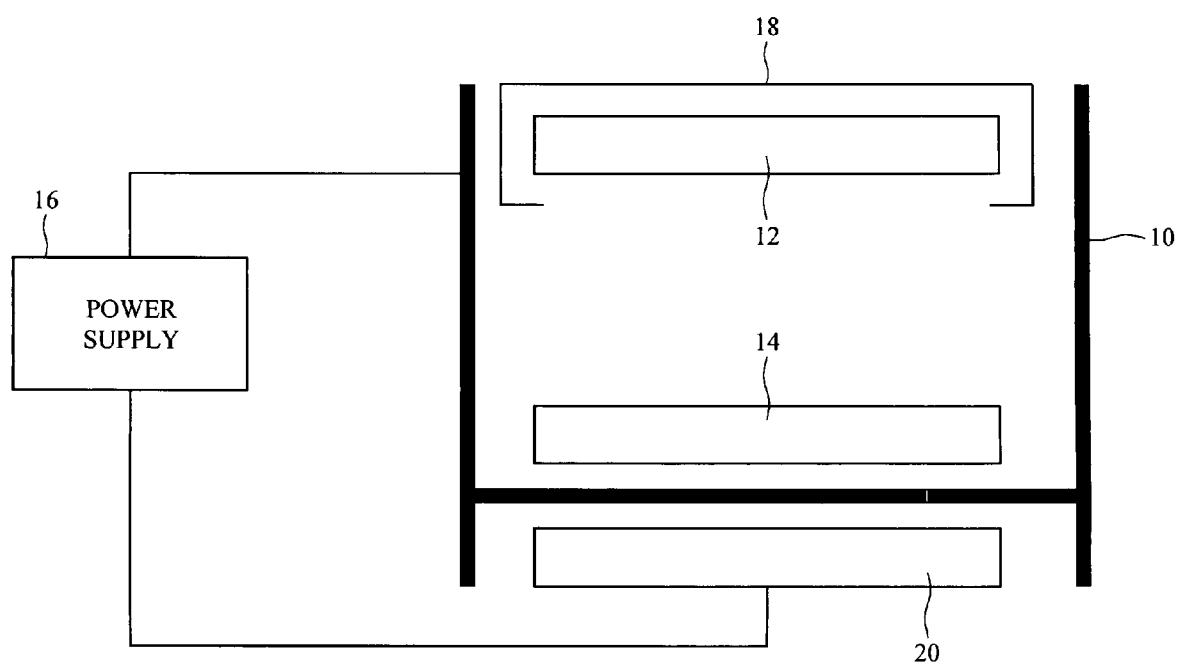
FIG. 1 is a combined block and diagrammatic view of electroplating apparatus forming the preferred embodiment of the invention.

Referring also to now FIG. 1, it has been furthered discovered that superior control over the plated copper microstructure can be achieved by applying a static charge on the wafer prior to commencing the immersion stage B. This static charge may be applied to the wafer using the arrangement shown in FIG. 1. A vessel or tank 10 holds quantity of a suitable plating bath, such as the types previously mentioned. A clam-shell shaped fixture 18 is adapted to hold and rotate the wafer 12. The wafer 12 acts as a cathode onto which material is deposited derived from a copper anode 14 disposed within the vessel 10 within the plating bath. A third electrode 20 is disposed beneath the vessel 10 but in proximity to the plating bath. A power supply 16 is coupled in an open circuit with electrode 20 and a fixture 18 so as to apply a static electric charge to the wafer 12. Depending upon the size and geometry of the components of an actual embodiment, it has been found that applying a bias voltage to the wafer 12 of between approximately 1 and 100 volts provides superior results. The static charge applied to the wafer 12 in this manner was found to enhance accelerator competitive adsorption on the surface of the wafer 12. It is believed that accelerator competitive adsorption is improved as a result of a static charge activating the accelerator.

Optimum results in terms of reduced defects was achieved using a combination of low bias entry and a static charge on the wafer during the immersion process, followed by higher annealing temperatures of approximately 260 degrees senegrate, for example. It should be noted here that the method and apparatus described above can also be used to electroplate silver with similar results.

It is to be understood that the specific methods and apparatus which have been described are merely are illustrative of one application of the principal of the invention. Numerous modifications may be made to the method and apparatus as described above without departing from the true spirit and scope of the invention.

What is claimed is:

1. A method electroplating a conductive material on a semiconductor wafer, comprising the steps of:
   (A) immersing the wafer in a plating bath;
   (B) applying a voltage to the wafer prior to immersing the water in a plating bath;
   (C) passing an electrical current through the bath and the wafer as the wafer is being immersed; and
   (D) limiting the current passing in step (C) as the wafer is being immersed to a density of not greater than 0.1 amps per square centimeter.

2. The method of claim 1, wherein the conductive material is copper.

3. The method of claim 1, wherein the conductive material is silver.

4. The method of claim 1, further comprising the steps of:
   (E) following step (A), holding the wafer in the bath for a preselected length of time to carry out electroplating of the conductive material on the wafer; and
   (F) reducing the voltage applied to the water while step (A) is being performed.

5. The method of claim 4, further comprising the step of increasing the voltage applied to the water after step (A) has been completed.

6. The method of claim 4, wherein step (F) includes reducing the voltage to less than 20% of the voltage applied to the wafer after step (A) has been completed.

7. The method of claim 1, wherein step (D) includes limiting the current density until step (A) has been completed.

8. The method of claim 1, further comprising the step of applying an electric charge to the wafer to enhance accelerator constituents in the plating bath.

9. The method of claim 8, wherein the electric charge is applied to the wafer using an electrode disposed outside of the plating bath.

10. The method of claim 8, wherein the electric charge is applied to the wafer before step (A) is commenced.

11. A method electroplating a conductive material on a semiconductor wafer, comprising the steps of:
    (A) immersing the water in a plating bath;
    (B) applying a voltage to the wafer;
    (C) passing an electrical current through the bath and the wafer; and
    (D) limiting the current passing in step (C) as the wafer is being immersed to a density of not greater than 0.1 amps per square centimeter;
    wherein an electric charge is applied to the wafer using an electrode disposed outside of the plating bath.

12. The method of claim 11, wherein the electric charge is applied to the wafer before step (A) is commenced.

13. The method of claim 11, wherein the conductive material is copper.

14. The method of claim 11, wherein the conductive material is silver.

15. The method of claim 11, further comprising the steps of:
    following step (A), holding the wafer in the bath for a preselected length of time to carry out electroplating of the conductive material on the wafer; and
    reducing the voltage applied to the wafer while step (A) is being performed.

16. The method of claim 11, further comprising the step of increasing the voltage applied to the wafer after step (A) has been completed.

17. The method of claim 16, wherein step (F) includes reducing the voltage to less than 20% of the voltage applied to the wafer after step (A) has been completed.

18. The method of claim 11, wherein step (D) includes limiting the current density to 0 amps per square centimeter until step (A) has been completed.

19. The method of claim 11, wherein the electric charge applied to the wafer in step (A) is between 1 and 100 volts.

20. The method of claim 11, wherein step (B) is performed before step (A).

21. The method of claim 11, wherein the electrical charge is a static electrical charge.

22. The method of claim 11, wherein the plating bath includes a plating accelerator additive.

23. A method electroplating a conductive material on a semiconductor wafer, comprising the steps of:
    (A) immersing the wafer in a plating bath;
    (B) applying a voltage to the wafer;
    (C) passing an electrical current through the bath and the wafer; and
    (D) limiting the current passing in step (C) as the wafer is being immersed to a density of not greater than 0.1 amps per square centimeter;
    wherein a static electric charge is applied to the wafer using an electrode disposed outside of the plating bath, said static electric charge applied to the wafer before step (A) is commenced.

* * * * *